(12) United States Patent
Wang

(10) Patent No.: US 6,760,353 B2
(45) Date of Patent: Jul. 6, 2004

(54) JITTER SUPPRESSION TECHNIQUES FOR LASER DRIVER CIRCUITS

(75) Inventor: Xin Wang, Irvine, CA (US)

(73) Assignee: Broadcom Corporation, Irvine, CA (US)

(*) Notice: Subject to any disclaimer, the term of this patent is extended or adjusted under 35 U.S.C. 154(b) by 0 days.

(21) Appl. No.: 10/209,293

(22) Filed: Jul. 30, 2002

(65) Prior Publication Data
US 2004/0022284 A1 Feb. 5, 2004

(51) Int. Cl.[7] .............................................. H01S 3/00
(52) U.S. Cl. ................................ 372/38.02; 372/38.07
(58) Field of Search ............................ 372/29.01–32, 372/38.1–38.09, 29, 38

(56) References Cited

U.S. PATENT DOCUMENTS

| | | | | |
|---|---|---|---|---|
| 5,757,233 A | * | 5/1998 | Kato et al. ................. | 330/254 |
| 5,883,910 A | * | 3/1999 | Link ......................... | 372/38.07 |
| 6,037,832 A | * | 3/2000 | Kaminishi .................. | 327/538 |
| 6,249,178 B1 | * | 6/2001 | Umeda ....................... | 327/563 |
| 2002/0085600 A1 | * | 7/2002 | Jung ......................... | 372/38.02 |
| 2002/0167693 A1 | * | 11/2002 | Vrazel et al. ............... | 359/109 |
| 2003/0030873 A1 | * | 2/2003 | Hietala et al. .............. | 359/181 |

* cited by examiner

*Primary Examiner*—Paul Ip
*Assistant Examiner*—Hung T Vy
(74) *Attorney, Agent, or Firm*—Christie, Parker & Hale, LLP

(57) ABSTRACT

Driver circuits of the present invention provide current to drive laser diodes. The output current of the driver circuit includes a data signal and a low frequency tone signal. The low frequency tone signal is within the bandwidth of a power control feedback loop. The tone signal introduces low frequency noise into the output signal of the driver circuit. The low frequency noise causes jitter at the zero crossing points of the driver circuit output signal. A laser driver circuit of the present invention provides a compensation current to a laser diode. The compensation current is out of phase with the tone signal. The compensation current eliminates the low frequency noise in the output signal of the laser driver circuit.

25 Claims, 4 Drawing Sheets

JITTER SUPPRESSION TECHNIQUES FOR LASER DRIVER CIRCUITS

BACKGROUND OF THE INVENTION

This patent application relates to driver circuits for laser diodes, and more particularly, to driver circuits that suppress jitter in tone modulated single ended output signals.

Laser diodes are used to convert electrical signals to optical signals in fiber optic communication systems. A laser driver circuit provides a current signal to drive a laser diode. The current signal contains modulated data. The laser diode outputs an optical signal that contains the modulated data.

A power control feedback loop controls the output signal of the laser diode. The power control feedback loop includes a photodiode. The photodiode monitors the optical power of the laser diode output signal and provides an electrical signal indicative of the laser diode output signal.

The power control feedback loop compares the photodiode output current with a reference signal. In response to this comparison, the power control feedback loop tunes the output signal of the laser driver dynamically to control the optical power of the laser diode.

Recently, there has been a drastic increase in the data rate used in laser diodes (especially in the OC192 range). The photodiode in the power control feedback loop cannot respond to a very fast data rate. The bandwidth of photodiodes is typically in the range of 1 MHz. However, the output signal of a laser diode operated at a fast data rate may, for example, be around 5 GHz.

Therefore, it is desirable to have a low frequency component of the laser diode output signal that can be sensed by the power control feedback loop. In order to provide a frequency component of the laser diode output signal that is within the bandwidth of the photodiode, a low frequency tone signal can be added to the laser driver output current. The tone frequency is low enough so that it is within the bandwidth of the photodiode. The tone signal allows the power control feedback loop to regulate the laser diode output signal, even when the laser diode output signal is otherwise outside the bandwidth of the photodiode.

However, at least one significant problem is caused by adding the tone signal to the laser driver output current. The tone signal can create extra jitter (i.e., unwanted noise signals) in the output signal of the laser driver circuit. This is true even though the tone signal has a very low frequency (e.g., 100 KHz).

Laser driver circuits typically use single-ended current output signals to drive laser diodes. It is more challenging to control jitter in a single ended signal than in a differential signal. Jitter in a laser driver becomes more serious when tone modulation is added to the laser driver.

The low frequency tone signal will cause a considerable amount of extra jitter even in a clean single ended signal. This extra jitter is not an issue for differential signals, because the zero crossing point does not change.

Therefore, it would be desirable to reduce jitter in laser driver circuits at the zero crossing points of the output signal.

BRIEF SUMMARY OF THE INVENTION

Driver circuits of the present invention can provide current to drive laser diodes. The current output signal of a driver circuit includes a data signal and a low frequency tone signal.

A power control feedback loop senses the optical output signal of the laser diode. The low frequency tone signal is within the bandwidth of the power control feedback loop. The power control feedback loop can monitor low frequency components provided by the tone signal to regulate the optical output signal of the laser diode.

The tone signal introduces low frequency noise into the output signal of the driver circuit. The low frequency noise causes jitter at the zero crossing points of the driver circuit output signal.

A laser driver circuit of the present invention provides a compensation current to a laser diode. The compensation current is out of phase with the tone signal. The compensation current eliminates the low frequency noise in the output signal of the laser driver circuit.

DETAILED DESCRIPTION OF THE INVENTION

Figure 1A:
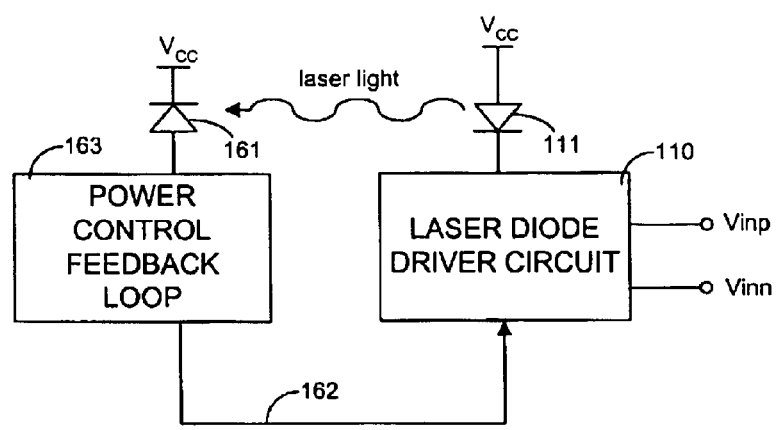
FIG. 1A illustrates an example of a power control feedback loop coupled to a laser diode and a laser diode driver circuit in accordance with the present invention.

FIG. 1A illustrates circuitry that can be used in an optical communication network. In an optical communication network, data is embedded within optical signals and transmitted along optical fiber networks. Optical signals are often transmitted over long distances in optical communication networks. An optical signal usually has to be amplified at various points along a long distance optical fiber network, because attenuation can degrade the quality of the signal.

To amplify an optical signal, the optical signal is first converted into an electrical signal and amplified. The electrical signal is then converted back into an optical signal. The circuitry shown in FIG. 1A can be used to convert an electrical signal into an optical signal in a communication network.

FIG. 1A illustrates a laser diode 111. Laser diode 111 is coupled to a laser diode driver circuit 110 in accordance with the present invention. Laser diode driver circuit 110 receives differential input data signal $V_{INP}$ and $V_{INN}$. Driver circuit 110 provides drive current to laser diode 111.

Photodiode 161 senses laser light from laser diode 111. Photodiode 161 is coupled to power control feedback loop 163. Power control feedback loop 163 outputs a feedback signal 162. Feedback signal 162 is provided to driver circuit 110.

Figure 1B:
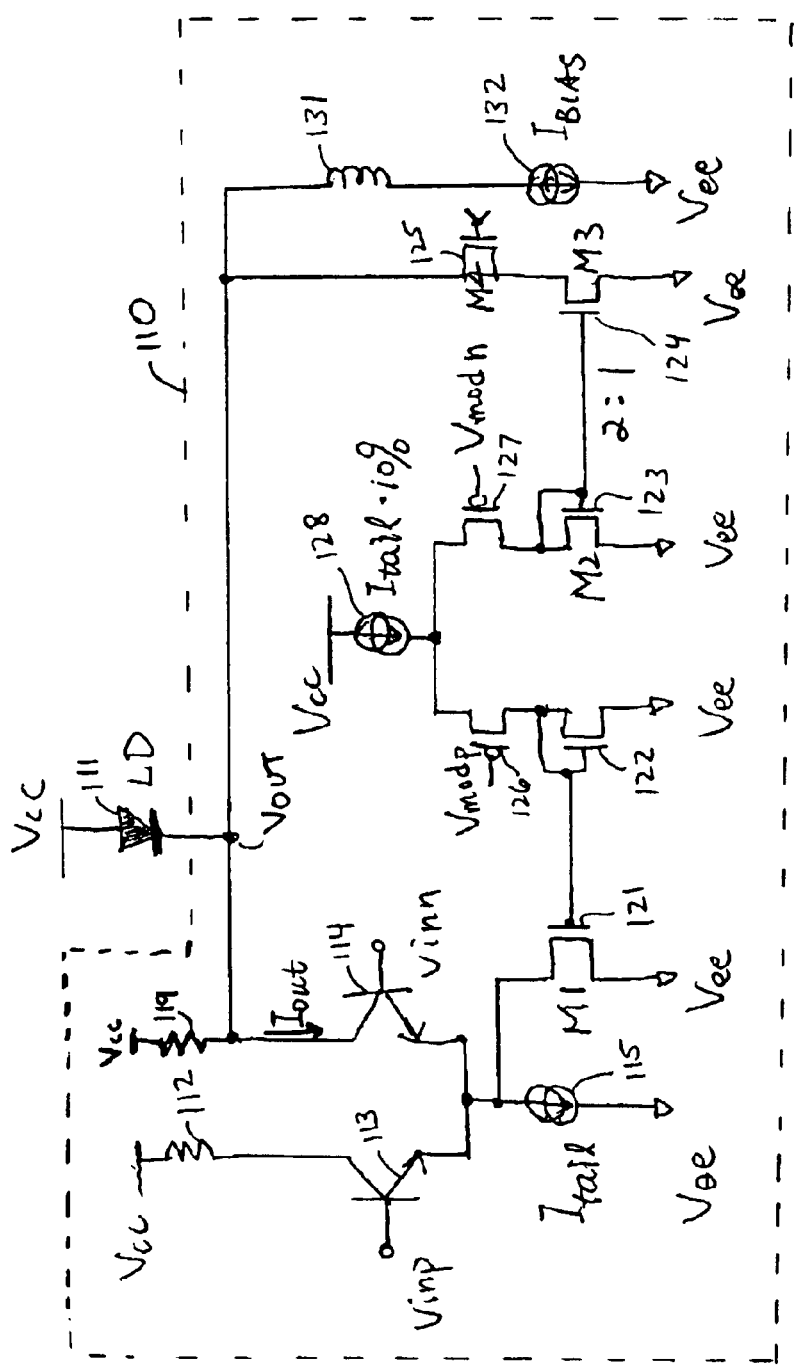
FIG. 1B illustrates an exemplary circuit implementation for one embodiment of a laser driver circuit in accordance with the present invention.

FIG. 1B illustrates additional details of a driver circuit 110 in accordance with an embodiment of the present invention. Driver circuit 110 includes differential pair transistors 113 and 114, resistors 112 and 119, current source 115, inductor 131, and current source 132. The driver circuit 110 provides current to drive laser diode 111.

Driver circuit 110 receives a differential voltage signal $V_{INP}$ and $V_{INN}$. The differential voltage signal $V_{INP}/V_{INN}$ contains modulated data. The differential voltage signal $V_{INP}$ and $V_{INN}$ is received at the bases of bipolar junction transistors (BJTs) 113 and 114. Transistors 113 and 114 form a differential pair.

A first current 1OUT flows from supply voltage $V_{CC}$ through laser diode 111 and transistor 114. A second current flows from $V_{CC}$ through resistor 112 and transistor 113. A third current flows from $V_{CC}$ through resistors 119 and transistor 114.

The total current through transistors 113 and 114 equals the current $I_{TAIL}$ through current source 115 plus the current through transistor 121.

Differential pair 113/114 converts the differential voltage signal $V_{INP}/V_{INN}$ into a single ended current data signal $I_{OUT}$ at the collector of transistor 114. Thus, the transistor 114 forms part of a current driver that generates current data signal $I_{OUT}$ that drives laser diode 111. Current source 132 also provides current to laser diode 111 through inductor 131.

Laser diode 111 outputs an optical laser signal in response to the current signal from driver circuit 110. Thus, laser diode 111 converts an electrical signal into an optical signal. The output signal of laser diode 111 is an optical data signal that is proportional to 1OUT Photodiode 161 is sensitive to the portion of the optical output of laser diode 111 that is within the photodiode's bandwidth. The current through photodiode 161 is effected by light from laser diode 111 that is within the photodiode bandwidth.

Current flows from $V_{CC}$ through photodiode 161. When photodiode 161 senses an increase in the optical output from laser diode 111, the current through photodiode 161 increases. Feedback signal 162 then causes the current through current sources 115 and 132 to decrease. When the current through current sources 115 and 132 decreases, the drive current provided to laser diode 111 and the optical output signal of laser diode 111 decrease.

When photodiode 161 senses a decrease in the optical output from laser diode 111, the current through photodiode 161 decreases. In response to feedback signal 162, the drive current provided to laser diode 111 increases.

In this way, power control feedback loop 163 regulates the optical output signal of laser diode 111. The circuit parameters of power control feedback loop 163 can be selected to regulate the output signal of laser diode 111 to a particular value.

Driver circuit 110 introduces a low frequency tone signal into 1OUT and the optical output signal of the laser diode. The frequency of the tone signal is small enough that it is within the bandwidth of photodiode 161 in power control feedback loop 163. Power control feedback loop 163 can sense the low frequency portion of the laser diode output signal introduced by the tone signal. Power control feedback loop 163 regulates the power output of laser diode 111 in response to the low frequency portion of the laser diode output signal, as discussed above.

Driver circuit 110 in FIG. 1B also includes field-effect transistors (FETs) 121–127 and current source 128. Transistors 122, 123, 126, and 127 create the low frequency tone signal in driver circuit 110. An oscillator circuit (not shown) generates a differential voltage signal ($V_{MODP}$ and $V_{MODN}$). Differential voltage signal $V_{MODP}/V_{MODN}$ is an alternating signal that has a low frequency (e.g., 100 kHz).

Signals $V_{MODP}$ and $V_{MODN}$ are provided to the gates of p-channel transistors 126 and 127. Current source 128 provides a bias current to transistors 126–127. The current provided by current source 128 equals a fraction such as 10% of the current $I_{TAIL}$ provided by current source 115.

Transistor 126 and 127 form a differential pair that converts differential voltage $V_{MODP}/I_{MODN}$ into a low frequency current signal through transistors 122 and 123.

Transistors 121 and 122 form a current driver e.g., a current mirror as shown in FIG. 1B. The channel width-to-length ratio (W/L) of transistor 121 equals the channel W/L of transistor 122. Therefore, the current through transistor 121 equals the current through transistors 122 and 126.

The current through transistor 121 is a low frequency tone signal generated by differential pair 126/127. The current through transistor 121 is added to the bias current $I_{TAIL}$ through current source 115. The current provided by current source 115 and transistor 121 together bias differential pair 113 and 114. As a result, the current output signal $I_{OUT}$ contains a low frequency component that corresponds to the tone signal.

The low frequency component of 1OUT is introduced by the extra bias current provided by transistor 121. The low frequency component of 1OUT produces a low frequency component in the output signal of laser diode 111 that is within the bandwidth of photodiode 161 in power control loop 163, as discussed above.

Figures 2A, 2B:
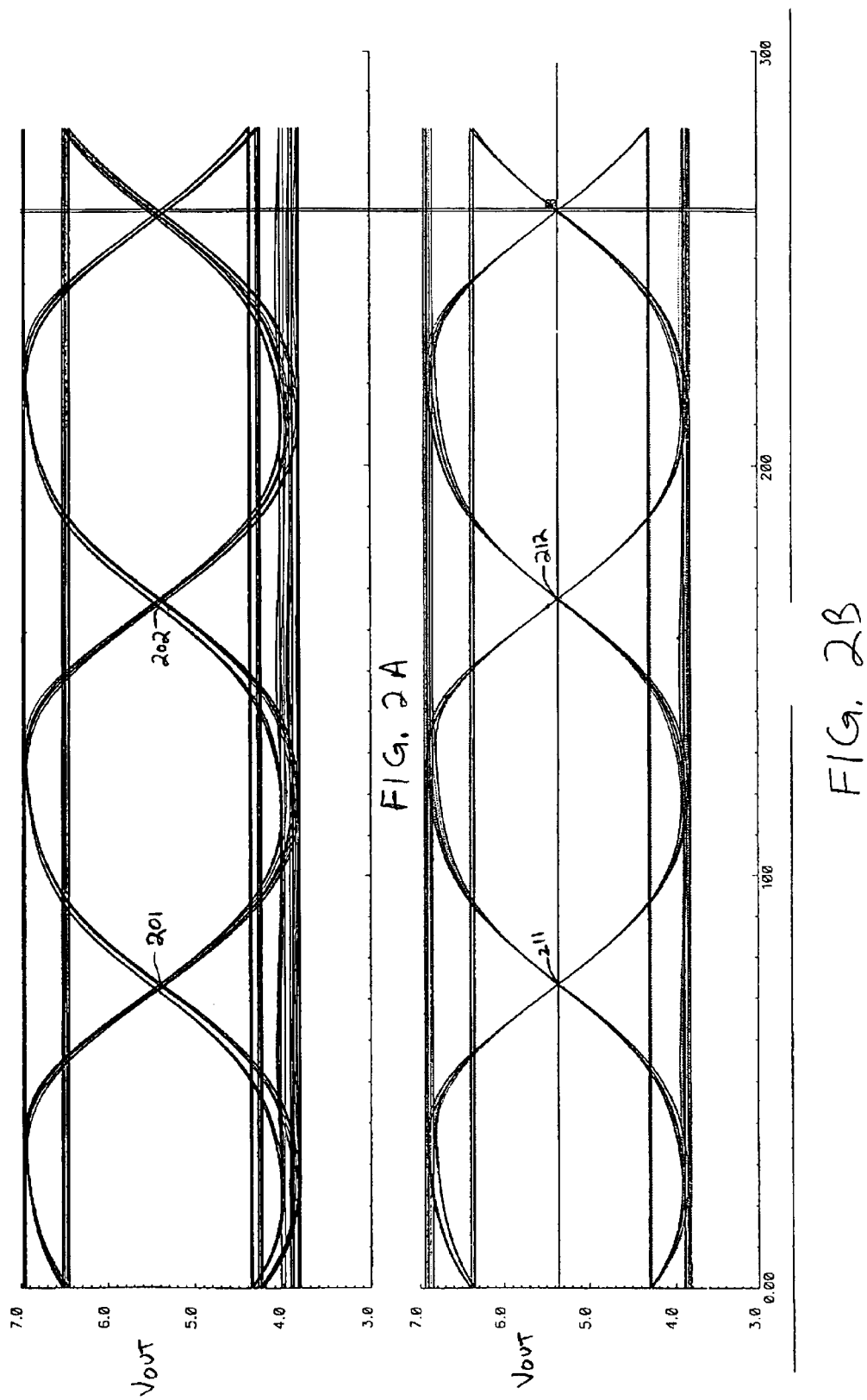
FIG. 2A illustrates a graph of the output signal of a laser diode driver circuit that does not have the jitter suppression techniques of the present invention.
FIG. 2B illustrates a graph of the output signal of a laser diode driver circuit that operates according to the jitter suppression techniques of the present invention.

The low frequency tone signal introduces jitter (i.e., high frequency noise) into signal 1OUT The effect of this jitter is illustrated in FIG. 2A. FIGS. 2A–2B plot the single ended voltage $V_{OUT}$ at the cathode of laser diode 111 over time.

The $V_{OUT}$ signal is measured so that portions of the signal are folded back in time as shown in FIGS. 2A–2B so that they overlap. Thus, portions of the signal $V_{OUT}$ that occur at different points in time overlap in FIGS. 2A–2B. The purpose of folding portions of $V_{OUT}$ back during the measurement is to illustrate the variations in the zero crossing points of the signal over time.

A zero crossing point of $V_{OUT}$ is the half way point between subsequent peaks and valleys of $V_{OUT}$ while it is rising and falling. For example, two zero crossing points 201 and 202 are illustrated in FIG. 2A. The jitter introduced by the tone signal causes the zero crossing points of $V_{OUT}$ to vary over time. The zero crossing points occur sooner in some cycles of $V_{OUT}$ and later in other cycles of $V_{OUT}$. Thus, the period of $V_{OUT}$ varies over time.

The variation in the period of $V_{OUT}$ is an undesirable effect that can cause errors during the transmission of the data signal through the communication network system. For example, a data signal that has been transmitted through an optical communication system is processed by digital circuitry when it is received at a destination point. The digital circuitry may include numerous flip-flops that temporarily store the data. The flip-flops are triggered by the rising and falling edges of clock signals recovered from the data signal or generated locally.

A short delay period is needed between a transition in the data signal and an edge of the clock signal so that a flip-flop can capture the data. If the data signal transitions too late with respect to the edge of the clock signal, the flip-flop may not be able to capture and store the data in the data signal.

The zero crossing points of the data signal represent roughly the half way point during a HIGH to LOW or a LOW to HIGH transition. When the period of the data signal varies as shown in FIG. 2A, some of the zero crossing points in the data signal may occur too late with respect to the edge of a clock signal to be captured by a particular flip-flop. Thus, the jitter effect makes it difficult to ensure that all of the data in the data signal will be captured and stored by the digital circuitry.

The present invention provides techniques that reduce or eliminate the jitter caused by the tone signal around the zero crossing points of the data signal. This aspect of the invention will now be discussed in further detail. Referring again to FIG. 1B, the differential pair of transistors 126/127 produces a low frequency tone signal in the form of a current through transistor 121 as discussed above. Differential voltage signal $V_{MODP}$ and $V_{MODN}$ also produces a low frequency tone signal in the form of a current through transistor 123. The low frequency current signal through transistor 123 is equal to, but 180 degrees out of phase with, the current through transistor 121. Transistors 121–123 all have the same channel W/L ratio.

Transistors 123 and 124 also form a current driver e.g., a current mirror circuit. In the examplary embodiment shown in FIG. 1B, the channel W/L ratio of transistor 123 is twice the channel W/L ratio of transistor 124. Therefore, the current through transistor 124 is one-half of the current through transistor 123. In further embodiments, other W/L, ratios may be used.

The current signal through transistor 124 is 180° out of phase with the current through transistor 121 and has half the amplitude of the transistor 121 current. The current conducted by transistors 124 and 125 is added to 1OUT to cancel out the jitter in the output signal.

Equation (1) represents an example of the high frequency data signal.

$$V_{INP}-V_{INN}=0.5+0.5 \sin(\omega_0 t) \quad (1)$$

where $\omega_0$ is the frequency of the data signal.

Equation (2) represents an example of a 10% tone modulated tail current $I_B$.

$$I_B=1+0.1 \sin(\omega_M t) \quad (2)$$

where $\omega_M$ is the frequency of the tone signal. The first term of equation (2) is provided by current source 115. The second term of equation (2) is provided by transistor 121. $I_B$ is the total current that drives differential pair transistors 113–114.

The output signal 1OUT can be derived by multiplying the data signal ($V_{INP}-V_{INN}$) from equation (1) by the bias current $I_B$ from equation (2). The result is shown by equation (3).

$$I^{OUT}=0.5+0.5 \sin(\omega_0 t)+0.05 \sin(\omega_M t)+0.05 \sin(\omega_M t) \sin(\omega_M t) \quad (3)$$

Third term (0.05 $\sin(\omega_M t)$) in equation (3) is introduced into 1OUT by the low frequency tone signal. This third term causes jitter in the zero crossing points of the output signal.

In driver circuit 110, the current signal provided by transistors 124 and 125 cancels out the third term in equation (3). By removing the third term of equation (3), transistors 124 and 125 provide a compensation current signal that removes the jitter at the zero crossing points in the output current signal of driver circuit 110.

Transistors 124 and 125 add a compensation current into the output current of driver circuit 110. The compensation current performs a high pass filter function for the spectrum of the laser diode output signal.

The output current signal of circuit 110 retains the portion of the tone signal that is represented by the fourth term (0.05 $\sin(\omega_0 t) \sin(\omega_M t)$) of equation (3). Photodiode 161 in the feedback loop can detect the portion of the tone signal represented by the fourth term in equation (3).

The portion of the signal introduced into the output by the fourth term of equation (3) produces two small tones around the center frequency $\omega_0$. Because these tones are close to $\omega_0$ and have a smaller amplitude than the data signal, they have a negligible effect on the jitter performance of the driver circuit.

Transistor 125 is a cascode device that reduces the loading on $I_{OUT}$. Transistor 125 also reduces the charge injection from 1OUT into transistor 124 and isolates transistor 124 from the high frequency signal 1OUT Driver circuit 110 also includes inductor 131 and current source 132. Current source 132 provides a current $I_{BIAS}$. Inductor 131 operates as an alternating current (AC) choke that blocks kickback noise into $I_{BIAS}$ Inductor 131 helps provide a more stable direct current (DC) through transistor 125.

FIG. 2B illustrates the output voltage signal $v_{OUT}$ for driver circuit 110 using the jitter suppression techniques of the present invention. Two zero crossing points of signal $V_{OUT}$ are labeled 211 and 212 in FIG. 2B. As can be seen in FIG. 2B, the jitter has been eliminated from $V_{OUT}$ at the zero crossing points. Therefore, the period of the output data signal remains constant over time. By removing the jitter from the data signal, the operation of flip-flop circuitry in an optical communication network is substantially improved.

Some jitter remains near the peaks and valleys of $V_{OUT}$ as can be seen in FIG. 2B. However, the jitter at the zero crossing points of the output signal has the most adverse effect on the operation of the data communication circuitry.

Figure 3:
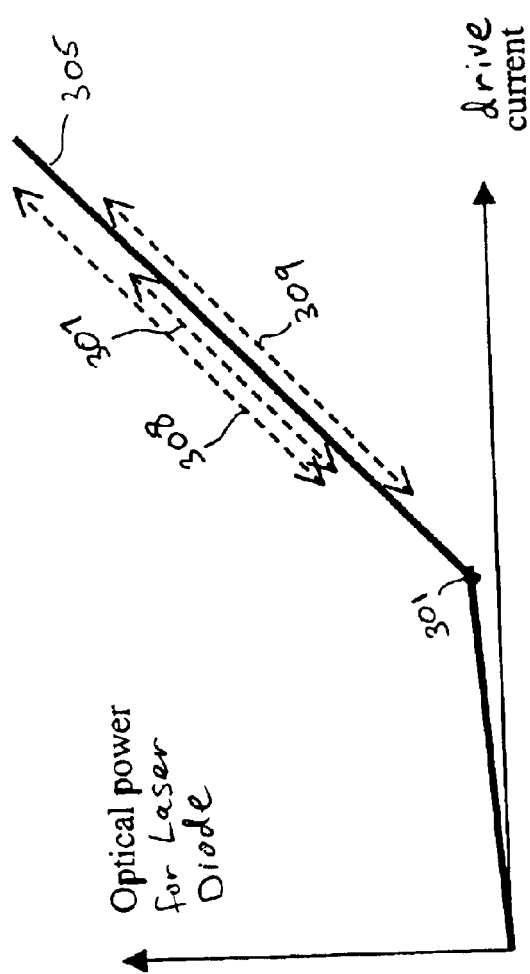
FIG. 3 illustrates a graph of the output optical power of a laser diode versus current in accordance with the principles of the present invention.

FIG. 3 is a graph that illustrates a transfer curve 305 for laser diode 111. Transfer curve 305 represents the optical power output signal of laser diode 111 versus the drive current through the laser diode. Dotted line 307 represents the range of optical power in curve 305 for a drive current signal that does not include a tone signal.

Dotted line 308 represents the range of optical power in curve 305 for a drive current signal that includes a tone signal. Dotted line 309 represents the range of optical power in curve 305 for a drive current signal that includes a tone signal and the jitter suppression techniques of the present invention.

As can be seen from line 309, the jitter suppression techniques of the present invention reduce the amplitude of the optical power (relative to line 308), while retaining the same midpoint as the optical power signal in line 307. The tone signal can be added to drive current without shifting the middle point of the optical power signal output of laser diode 111.

As shown in FIG. 3, optical power transfer curve 305 has a non-linearity at point 301. The non-linearity in transfer curve 305 causes the noise at the bottom of the sinusoidal waveform $V_{OUT}$ (shown in FIG. 2B) to be eliminated from the output signal of laser diode 111. However, the noise at the top of the sinusoidal waveform $V_{OUT}$ (shown in FIG. 2B) appears in the output signal of laser diode 111. This effect creates a low frequency signal that can be sensed by photodiode 161 in the power control feedback loop.

If both the top and the bottom of the $V_{OUT}$ signal are synchronous (at the tone frequency), there is no low frequency component of the $V_{OUT}$ signal. By removing one side (the lower portion of $V_{OUT}$) and only leaving the top portion of $V_{OUT}$ moving, the low frequency (tone) component of $V_{OUT}$ appears in the waveform spectrum.

In further embodiments, driver circuits of the present invention can include CMOS, Bipolar, and BiCMOS implementations. Any of the transistors shown in FIG. 1B may be substituted with FETs, MOSFETs, or BJTs. For example, bipolar transistors 113–114 may be substituted with FETs.

While the present invention has been described herein with reference to particular embodiments thereof, a latitude of modification, various changes, and substitutions are intended in the present invention. In some instances, features of the invention can be employed without a corresponding use of other features, without departing from the scope of the invention as set forth. Therefore, many modifications may be made to adapt a particular configuration or method disclosed, without departing from the essential scope and spirit of the present invention. For example, the types and polarities of transistors employed in the circuit implementation of FIG. 1B are for illustrative purposes, and other types of transistors can also be used. It is intended that the invention not be limited to the particular embodiment disclosed, but that the invention will include all embodiments and equivalents falling within the scope of the claims.

What is claimed is:

1. A method for providing current to a laser diode, the method comprising:
    converting a voltage data signal into a first current signal using a first current driver;
    generating second and third current signals, using a first differential pair in response to an alternating voltage signal, wherein the second and third current signals have a lower frequency than the voltage data signal, the second current signal being cut of phase with the third current signal; and
    biasing the first current driver using a second current driver in response to the second current signal, wherein the first current signal and the third current signal are provided to the laser diode.

2. The method of claim 1 wherein generating the third current signal further comprises using a current mirror circuit to generate the third current signal.

3. The method of claim 2 wherein the current mirror circuit has a first transistor and a second transistor,
    and wherein the first transistor is coupled to the first differential pair, the second transistor provides the third current, and the first transistor has a channel width-to length ratio that is twice the channel width-to length ratio of the second transistor.

4. The method of claim 2 wherein generating the third current signal further comprises coupling a cascode transistor to the second current mirror circuit.

5. The method of claim 1 further comprising:
    coupling an inductor to the first current driver and to a current source.

6. The method of claim 1 wherein biasing the first current driver further comprises biasing the first current driver using a constant current source and the second current signal.

7. The method of claim 1 wherein the first current drive comprises a second differential pair.

8. The method, of claim 1 wherein the second current driver comprises a current mirror circuit.

9. A driver circuit that provides current to a laser diode at an output, the driver circuit comprising:
    a first differential pair coupled to the output, the first differential pair receiving a first data signal;
    a second differential pair receiving a second signal that has a lower frequency than the first data signal;
    a first current mirror circuit coupled between the first and the second differential pairs;
    a second current mirror circuit coupled to the second differential pair; and
    a cascode device coupled to the second current mirror and the output.

10. The driver circuit of claim 9 wherein the second current mirror circuit comprises first and second transistors coupled together, the second transistor having a channel width-to-Length ratio that is one-half of the channel width-to-length ratio of the first transistor.

11. The driver circuit of claim 9 further comprising an inductor coupled to the output and a current source coupled to the inductor.

12. The driver circuit of claim 9 further comprising:
    a first current source coupled to provide a first bias current to the first differential pair; and
    a second current source coupled to provide a second bias current to the second differential pair, wherein the second bias current is a fraction of the first bias current.

13. A driver circuit that provides output current to a laser diode, the driver circuit comprising:
    first and second transistors that convert a voltage data signal into a first current signal;
    a third transistor that provides a second current signal to the first and second transistors, wherein the second current signal has a lower frequency than the voltage data signal;
    a fourth transistor providing a third current signal that in out of phase with the second current signal, wherein the output current of the driver circuit includes the first and the third current signal; and
    a first differential pair that generates fourth and fifth current signals in response to an alternating signal, wherein the fourth current signal is out of base with the fifth current signal.

14. The driver circuit of claim 13 wherein the amplitude of the third current signal is half the amplitude of the second current signal.

15. The driver circuit of claim 13 wherein the third transistor is part of a first current mirror circuit that generates the second current signal in response to the fourth current signal; and
    wherein the fourth transistor is part of a second current mirror circuit that generates the third current signal in response to the fifth current signal.

16. The driver circuit of claim 13 further comprising:
    a first current source that provides a first constant current to bias the first and second transistors; and
    a second current source that provides a second constant current to bias the first differential pair, wherein the second constant current is a fraction of the first constant current.

17. The driver circuit of claim 13 further comprising:
    a current source coupled to an inductor that provides a sixth current signal, wherein the output current of the driver circuit includes the sixth current signal.

18. The driver circuit of claim 13 wherein the driver circuit is coupled to a power control feedback loop that includes a photodiode, the photodiode sensing at least a portion of an optical output signal of the laser diode.

19. The driver circuit of claim 13 wherein the first and second transistors comprise a second differential pair.

20. A laser diode driver circuit comprising:
    means for generating a single ended current signal from an input voltage data signal;
    means for generating a second current signal comprising a differential pair, coupled to receive a periodic voltage signal, and a current driver, coupled to the differential pair to conduct the second current signal;

wherein the second current signal has a lower frequency than the single ended current signal, and wherein the second current signal is a bias currant to generate the single ended current signal; and means for generating a third current signal that is out of phase with the second current signal, wherein an output current of the laser diode driver circuit includes the input voltage data signal and the third current signal.

21. The laser diode driver circuit of claim 20 wherein the means for generating the signal ended current signal comprises a differential pair of transistors.

22. The laser diode driver circuit of claim 20 wherein the current driver comprises a first current mirror circuit.

23. The laser diode driver circuit of claim 22 wherein the means for generating the third current signal comprises a second current mirror circuit coupled to the differential pair, the second current mirror circuit conducting the third current signal.

24. The laser diode driver circuit of claim 23 wherein the second current mirror circuit has a first transistor and a second transistor, and wherein the first transistor is coupled to the differential pair, the second transistor conducts the third current signal, and the first transistor has a channel width-to-length ratio that is twice the channel width-to-length ratio of the second transistor.

25. The laser diode driver circuit of claim 20 wherein the single ended current signal is regulated by a power control feedback loop, and the power control, feedback loop includes a photodiode that senses at least a portion of an optical output signal of a laser diode that is coupled to the laser diode driver circuit.

* * * * *